United States Patent

Weng

Patent Number: 5,224,106
Date of Patent: Jun. 29, 1993

[54] MULTI-LEVEL ERROR CORRECTION SYSTEM
[75] Inventor: Lih-Jyh Weng, Lexington, Mass.
[73] Assignee: Digital Equipment Corporation, Maynard, Mass.
[21] Appl. No.: 521,224
[22] Filed: May 9, 1990
[51] Int. Cl.⁵ ............................................. G06F 11/00
[52] U.S. Cl. .................................. 371/37.4; 371/37.1
[58] Field of Search ................... 371/37.4, 37.1, 40.1, 371/37.5, 37.7, 38.1, 39.1, 44, 45

[56] References Cited

U.S. PATENT DOCUMENTS

| | | | |
|---|---|---|---|
| 4,413,339 | 11/1983 | Riggle et al. | 371/40.1 |
| 4,447,902 | 5/1984 | Wilkinson | 371/39 |
| 4,486,882 | 12/1984 | Piret et al. | 371/45 |
| 4,586,183 | 4/1986 | Wilkinson | 371/39 |
| 4,606,026 | 8/1986 | Baggen | 371/39 |
| 4,630,272 | 12/1986 | Fukami et al. | 371/37 |
| 4,646,301 | 2/1987 | Okamoto et al. | 371/37 |
| 4,665,537 | 5/1987 | Moriyama | 371/37 |
| 4,726,028 | 2/1988 | Himeno | 371/37 |
| 4,763,330 | 8/1988 | Shimizu | 371/37.1 |
| 4,769,818 | 9/1988 | Mortimer | 371/37 |
| 4,769,819 | 9/1988 | Matsutani et al. | 371/38 |
| 4,782,490 | 12/1988 | Tenengolts | 371/40 |
| 4,785,451 | 11/1988 | Sako et al. | 371/37 |
| 4,833,679 | 5/1989 | Anderson et al. | 371/38 |
| 4,856,003 | 8/1989 | Weng | 371/37.1 |
| 4,989,211 | 1/1991 | Weng | 371/37.1 |
| 5,038,350 | 8/1991 | Mester | 371/37.4 |

FOREIGN PATENT DOCUMENTS 0261626  9/1987  European Pat. Off. .
0335529  3/1989  European Pat. Off. .

Primary Examiner—Robert W. Beausoliel, Jr.
Assistant Examiner—Phung My Chung
Attorney, Agent, or Firm—Cesari and McKenna

[57] ABSTRACT

A system separates data into "i" interleaved section of "k" symbols each and encodes each and encodes each section using a relatively weak (n,k) ECC. The system thus generates for each k symbols an n symbol code word containing "n-k", or "r" redundancy symbols, or a total of "ri" redundancy symbols. The system segments the ri redundancy symbols into "m" multi-symbol sections, namely, R(1), R(2), ..., R(m), which contain corresponding symbols from each of the i code words. The system then encodes each of these sections using various ECC's and generates Q(2), ..., Q(m) redundancy symbols, respectively. The system then records just the data, the section R(1) redundancy symbols and the Q(2), ..., Q(m) redundancy symbols. When the system later retrieves the data, the system decodes the data code word-by-code word using the (n,k) ECC and reproduces the R(2), ..., R(m) redundancy symbols in each code word. The system also corrects, if possible, any errors in the data. If this decoding does not correct all the errors, the system uses the Q(2) redundancy symbols and the ECC used to generate the Q(2) symbols to fill in missing section R(2) code word symbols and tries to correct the corresponding code words using the (n,k) ECC. If necessary, the system fills in redundancy symbols in the next section, i.e., section R(3), using the Q(3) symbols and the associated ECC. The system then uses the (n,k) ECC to correct more errors in the data, and so on.

16 Claims, 7 Drawing Sheets

MULTI-LEVEL ERROR CORRECTION SYSTEM

FIELD OF THE INVENTION

The invention relates generally to error correction of data and more particularly to improved techniques for multi-level encoding and decoding.

BACKGROUND

The importance of error correction coding of data in digital computer systems has increased greatly as the density of the data recorded on mass storage media, more particularly magnetic disks, has increased. With higher recording densities, a tiny imperfection in the recording surface of a disk can corrupt a large amount of data. In order to avoid losing that data, error correction codes ("ECC's") are employed to, as the name implies, correct the erroneous data.

Before a string of data symbols is recorded on a disk, it is mathematically encoded to form ECC, or redundancy, symbols. The redundancy symbols are then appended to the data string to form code words—data symbols plus redundancy symbols—and the code words are then stored on the disk. When the stored data is to be accessed from the disk, the code words containing the data symbols are retrieved from the disk and mathematically decoded. During decoding any errors in the data are detected and, if possible, corrected through manipulation of the redundancy symbols [For a detailed description of decoding see Peterson and Weldon, *Error Correcting Codes*, 2d Edition, MIT Press, 1972].

Stored digital code words can contain multiple errors. One of the most effective types of ECC used for the correction of multiple errors is a Reed-Solomon code [For a detailed description of Reed-Solomon codes, see Peterson and Weldon, *Error Correcting Codes*]. Error detection and correction techniques for Reed-Solomon ECC's are well known. Id. One such technique begins with again encoding the code word data to generate a new set of redundancy symbols and then comparing this set of redundancy symbols with the redundancy symbols in the retrieved code word, i.e. the set of redundancy symbols generated by the pre-storage encoding of the data, to detect any errors in the retrieved code word. [For a detailed discussion of this error detection technique, see U.S. Pat. No. 4,413,339 issued to Riggle and Weng].

Errors in stored data often occur in patterns such as multi-symbol bursts. Such errors may be caused by, for example, an imperfection in the recording medium. Various encoding and decoding schemes have been developed to correct common error patterns. One scheme developed for bursts is interleaving. Interleaving involves separating the data into a number of sections and, using an ECC, separately encoding each section to form a code word. Each code word thus contains a section of the data and a related set of redundancy symbols. The interleaved data and the redundancy symbols from all the sections are then recorded. Typically, the interleaved data symbols are recorded contiguously, followed by the redundancy symbols. Burst errors, which affect a number of contiguous (interleaved) data symbols, cause a small number of errors in each of several code words.

When the data and redundancy symbols are later retrieved, the various sets of redundancy symbols are used to correct errors in the data sections associated with them. Thus a given set of redundancy symbols protects a portion of the data, and presumably, corrects only a portion of any error burst. Accordingly, an ECC which is designed to correct "x" erroneous symbols can correct bursts which are longer than x symbols by correcting them section-by-section. The ECC selected for such a scheme can be less powerful than one which must correct burst errors without partioning them. The advantages to using a less powerful ECC are simpler encoding/decoding hardware and (typically) faster correction. [For a detailed description of interleaving encoding, see Peterson and Weldon, *Error Correcting Codes*].

Another scheme used to correct common error patterns is multi-level encoding. Multi-level encoding involves encoding data once using an ECC and/or a technique which is designed to correct the most common error patterns and then encoding the data a next time using another ECC and/or technique which is designed to correct the next most common error patterns, and so on. Multi-level decoding involves correcting the data using the first level ECC or technique and, if errors then remain, correcting them using the second level ECC or technique, and so on.

For example, a first level of encoding may consist of encoding the data with a relatively weak ECC. A second level of encoding may consist of again encoding the data with a more powerful ECC. Such a two-level scheme is disclosed in U.S. Pat. Nos. 4,706,250 and 4,525,838 to Patel. The Patel scheme disclosed in the two patents first encodes the data using an ECC which corrects $e_a$ errors. Patel separates a block of data into "i" sections, or sub-blocks, of "k" symbols each and separately encodes each k-symbol section using a first ECC. This level of encoding generates "p" redundancy symbols for each data section, or a total of "ip" redundancy symbols.

Patel next adds together (exclusive OR's) the corresponding data symbols in each sub-block and treats the resulting k symbols as an additional "data" section. Patel then encodes these symbols using a more powerful ECC which can correct up to $e_b$ errors ($e_b \geq e_a$). This second encoding generates "s" additional redundancy symbols. Patel stores the data and the ip and s redundancy symbols, that is, the redundancy symbols generated during the two levels of encoding. He does not store the k additional "data" symbols.

The Patel scheme can correct up to $e_a$ errors in each sub-block using the first level, or level-1, ECC and up to $e_b$ errors in any one sub-block using the level-2 ECC. Accordingly Patel attempts first to correct any errors in the data using the level-1 ECC. If all the errors are corrected using this ECC, he stops the error correction decoding operation and does not use the level-2 ECC. If all but one sub-block is corrected, the level-2 code is used in an attempt to correct it. Patel thus exclusive OR's the corresponding data symbols in each section which include the symbols corrected using the level-1 ECC and the erroneous symbols which the level-1 code did not correct, to form k "data" symbols which correspond to the k-symbol additional data section generated during encoding. Patel then attempts to correct the errors in these k-symbols using the level-2 code.

If there are $e_b$ or fewer errors, the level-2 code determines the locations of the erroneous symbols within the k-symbol "data" section and generates the associated error values, that is, the symbols which must be exclusive OR'd with the erroneous symbols to correct them.

Patel translates the error locations to the sub-block which contains the errors and corrects them using the generated error value symbols.

If the data contains more than $e_b$ errors per sub-block, or more than one sub-block with more than $e_a$ errors, the Patel scheme can not correct the errors. Thus, as more errors occur because of increased recording densities, it is desirable to employ an error correcting scheme which is capable of correcting a greater number of errors.

One solution is to use a more powerful ECC at each level. This creates three problems. First, the more powerful ECCs generate additional redundancy symbols. Thus more storage space must be allocated to the data, and less data can be recorded in a given storage space. Second, the more powerful ECCs require more complex, and thus more expensive, encoding and decoding hardware and/or software. Third, the ECCs require more time to correct the errors than the ECCs which use fewer redundancy symbols.

As data transfer technologies improve, and the speed with which data may be retrieved from a disk increases, a slower, more complex ECC acts as a limit on the speed with which data may be transferred. Accordingly, what is needed is a more powerful encoding scheme which can quickly correct errors, is easily implemented and does not require excess amounts of storage space.

SUMMARY

The invention is a multi-level encoding scheme which uses in higher levels of encoding the redundancy symbols generated during a first level of encoding such that all the levels together form a powerful and quick error correction scheme. The multi-level encoding scheme need not retain all of the redundancy symbols because these symbols can be regenerated from a selected number of retained symbols, as explained below.

A system using the inventive multi-level encoding scheme first separates the data into "i" sections of "k" symbols each, or i sub-blocks, and encodes each sub-block using an (n,k) ECC. The data symbols may or may not be interleaved. This first level of encoding generates for each k data symbols an "n" symbol code word containing "n-k", or "r" redundancy symbols, or a total of "ri" redundancy symbols.

The system next segments the ri redundancy symbols into "m" multi-symbol sections, namely, R(1), R(2), ... , R(m), which contain corresponding symbols from each of the i code words. The system then encodes each of these sections using either the same ECC, or, preferably, ECC's of decreasing strength. Thus it encodes, for example, a first redundancy symbol, $w_{j+1}$, from each of the i level-1 code words and generates $q_2$ redundancy symbols, the $w_{j+1}$ redundancy symbols and $q_2$ generated redundancy forming a level-2 code word. Next it encodes a second redundancy symbol, $w_{j+2}$, from each of the i code words and generates another $q_2$ redundancy symbols, forming a second level-2 code word, and so forth. The level-2 redundancy symbols corresponding to the various sections R(2) ... R(m), are in sections Q(2), ... , Q(m), respectively. The system then records the data, the section R(1) redundancy symbols and the section Q(2), ... ,Q(m) redundancy symbols. It does not record the redundancy symbols in sections R(2), ... , R(m), however, because these symbols can be re-generated using the recorded R(1) and Q(2), ... , Q(m) redundancy symbols, as set forth below.

When data is retrieved from storage, it is decoded code word-by-code word using the level-1 ECC. The system uses the retrieved section R(1) symbols as redundancy symbols and treats the "missing" section R(2) . . . R(m) symbols as erasure errors. The level-1 ECC is thus used to fill in the redundancy symbols in sections R(2), ... , R(m) for each level-1 code word and also to correct, if possible, any errors in the retrieved data and section R(1) redundancy symbols. If the level-1 decoding does not correct all the errors and erasures using only the retrieved section R(1) symbols as redundancy symbols, the system uses the section Q(2) redundancy symbols and the level-2 ECC to fill in missing section R(2) redundancy symbols. Next, the system tries to correct the corresponding level-1 code words using the level-1 ECC and the retrieved and filled-in redundancy symbols in sections R(1) and R(2). If necessary, the system fills in any uncorrected redundancy symbols in the next section, i.e., section R(3), using the section Q(3) symbols and the level-3 ECC. It then uses the level-1 ECC and the redundancy symbols in sections R(1), R(2) and R(3) to correct more errors in the data, and so on.

BRIEF DESCRIPTION OF THE DRAWINGS

The above and further advantages of the invention may be better understood by referring to the following description in conjunction with the accompanying drawings, in which.

DETAILED DESCRIPTION

Figure 1:
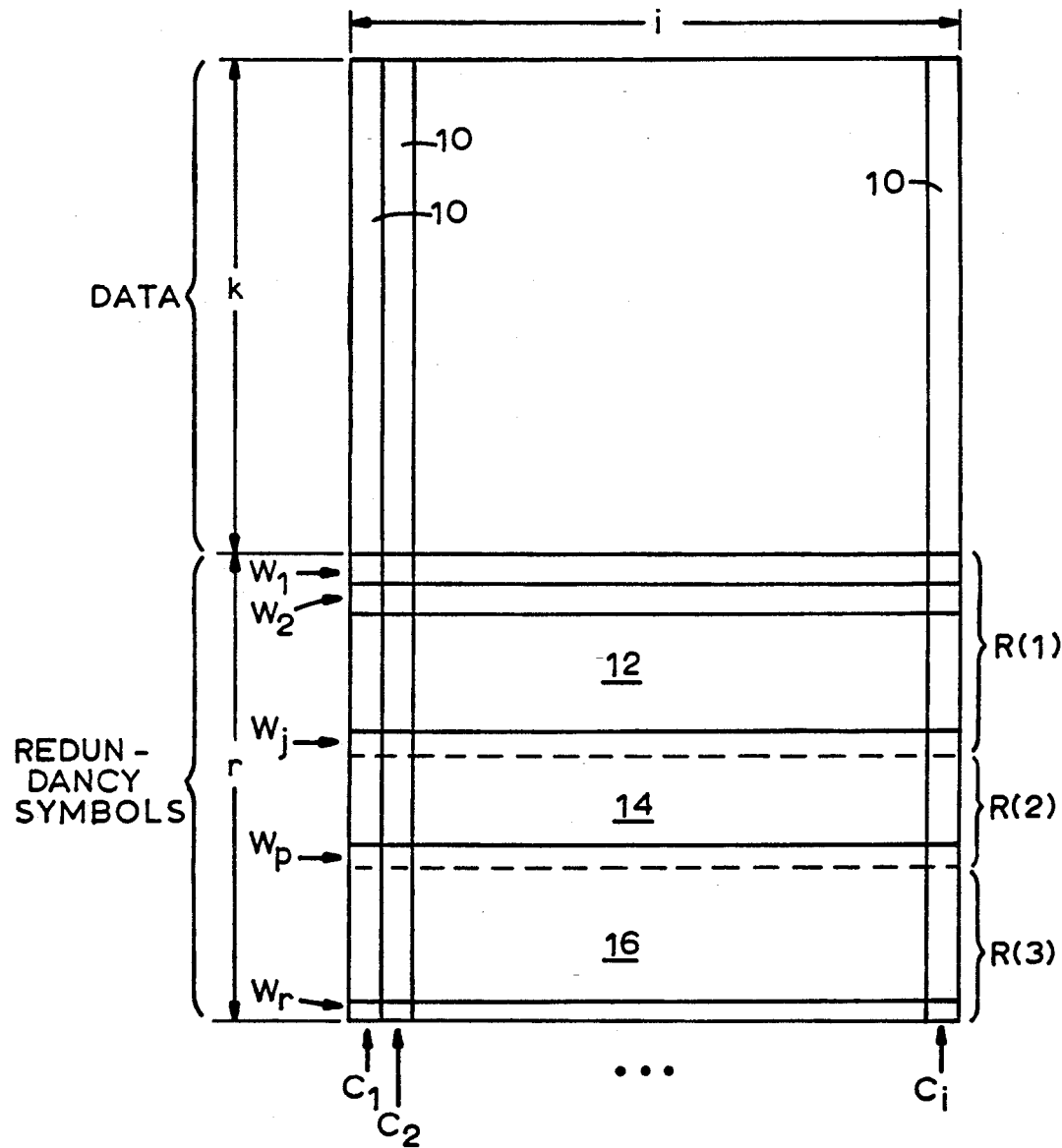
FIG. 1 is a block diagram of interleaved code words generated in accordance with a first level of encoding.

With reference to FIG. 1, a system (not shown) separates a string of "ki" data symbols into "i" sections, or sub-blocks, of "k" symbols each. The system may first interleave the ki data symbols. These i sections are arrayed as columns 10 in the drawing. The system performs a first level encoding using an (n,k) ECC and conventional techniques, and encodes each section of data to form a level-1 code word consisting of k data symbols and "n-k", or "r", redundancy symbols. The code words correspond to columns $c_1, c_2, \ldots, c_i$ of the array in the drawing. The system thus generates "ri" redundancy symbols in the first level of encoding.

The system next segments the ri redundancy symbols into m sections 12–16, R(1), R(2), ... , R(m), of arbitrary size, where m=3 in the exemplary embodiment. Each section, preferably, contains at least two redundancy symbols, which is the number of symbols required to correct one erroneous data symbol. Thus each section 12–16 contains at least two rows in the array depicted in the drawing.

Figure 2:
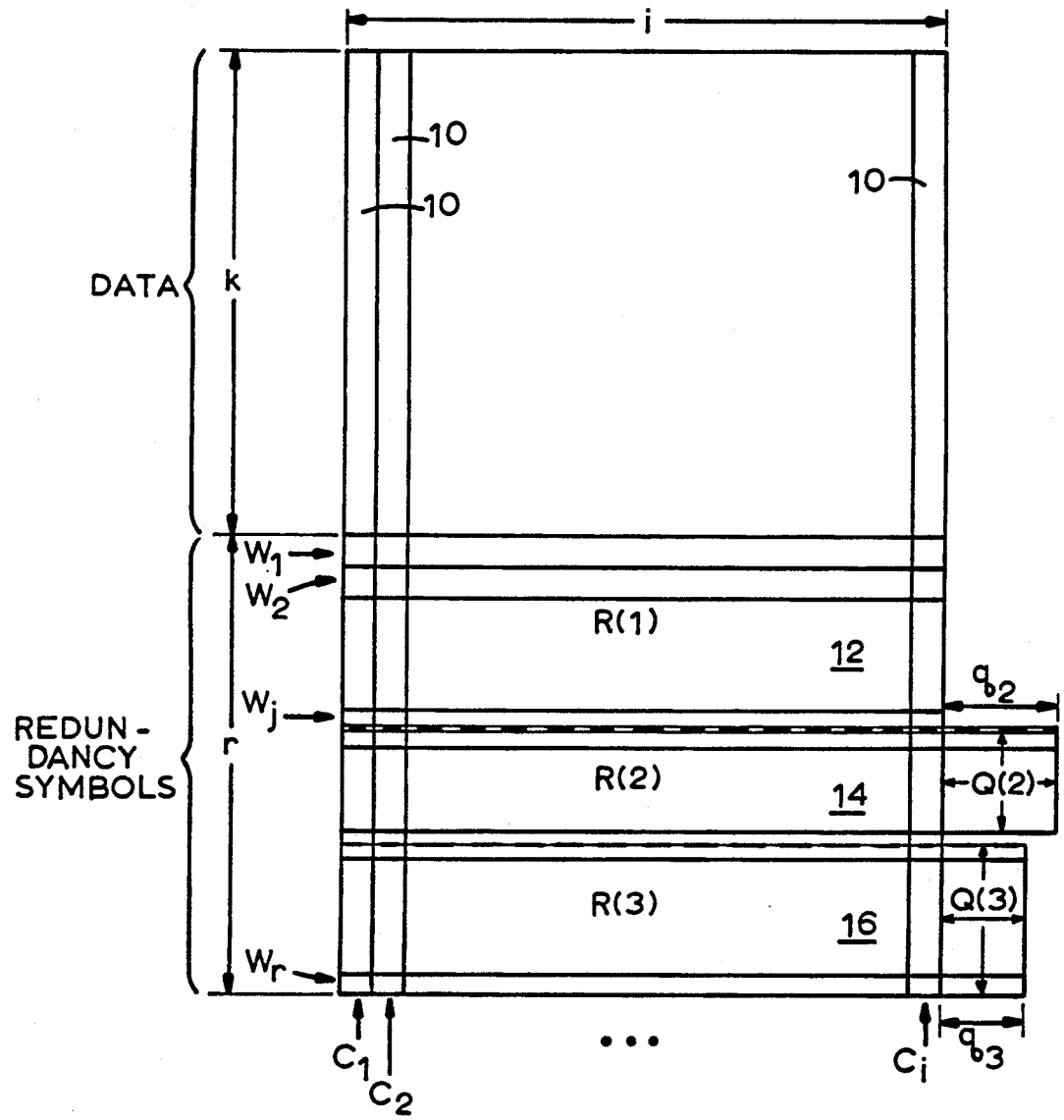
FIG. 2 is a block diagram of the code words of FIG. 1 further encoded using a second and third level of encoding.

Referring now to FIG. 2, the system encodes the symbols in section R(2) using a second level of encoding. It thus encodes as "information" symbols the corresponding redundancy symbols from each of the i code words, that is, each row, "$W_a$", of section R(2), using a second ECC. This second level of encoding generates for each row $w_{j+1}, \ldots, w_P$ of section R(2), "$q_2$" redundancy symbols. Each row consisting of i information symbols and $q_2$ redundancy symbols forms a level-2 code word. The system thus generates in this level of encoding a total of $(p-j+1)q_2$ redundancy symbols. These symbols are depicted as section Q(2) in the drawing. Generally, number of symbols in section Q(2) < number of symbols in section R(2).

The system next performs a third level of encoding by similarly encoding the symbols in section R(3). It thus encodes the corresponding redundancy symbols from each of the i code words using an ECC which, preferably, is less powerful than the level-2 code. The third level of encoding generates for each row $w_{p+1}$, $w_{p+2} \ldots w_r$ of section R(3), "$q_3$" redundancy symbols. Each row consisting of i "information" symbols and $q_2$ redundancy symbols forms a level-3 code word. The system thus generates in this level of encoding a total of $(r-p+1)q_3$ redundancy symbols. These symbols are depicted as section Q(3) in the drawing. Generally, the number of symbols in section Q(3) < the number of symbols in section R(3).

Figure 3:
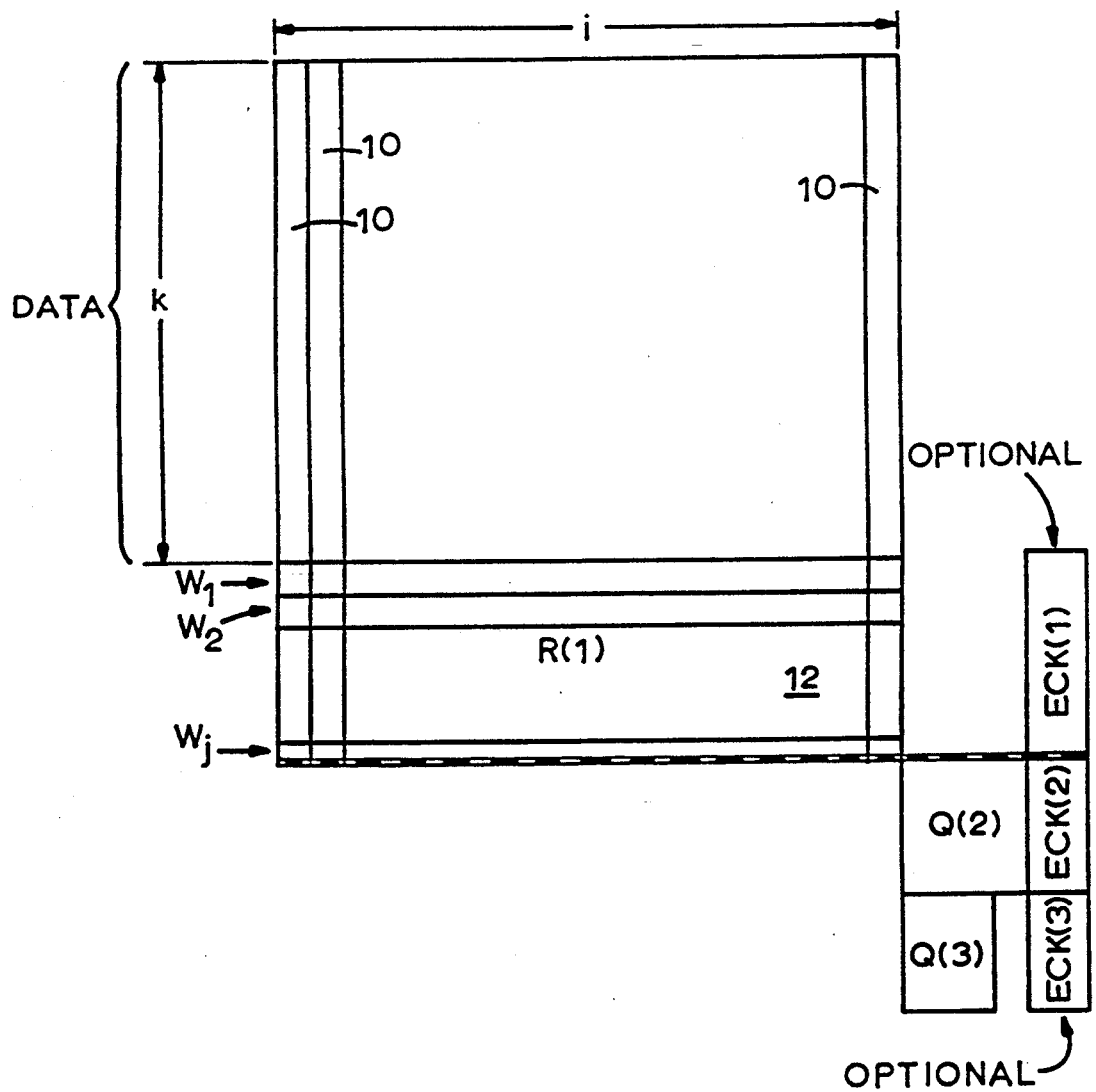
FIG. 3 is a block diagram of portions of the code words of FIG. 2 which are retained in memory.

Referring now to FIG. 3, the system stores in memory (not shown) the ki data symbols and the section R(1), Q(2) and Q(3) redundancy symbols. It does not store the section R(2) and R(3) redundancy symbols, however, because these symbols can be re-generated using the stored section R(1), Q(2) and Q(3) redundancy symbols, as explained below. The section R(2) and R(3) symbols are thus intentionally "erased." Each of the erased symbols is treated during decoding as an erasure, that is, an error with a known location.

Optionally, the system may also encode the stored sections R(1), Q(2) ... Q(m) redundancy symbols using one or more ECCs, which generates redundancy symbols ECK(1), ECK(2) and ECK(3). These symbols are then stored along with the data and the section R(1), Q(2) and Q(3) symbols. During decoding, these (optional) redundancy symbols may be used to correct any errors in the stored redundancy symbols before the redundancy symbols are used to re-generate the erased symbols. The optional symbols are thus an added layer of protection for both the stored symbols and the erased symbols.

The data symbols are protected by m levels of encoding. The storage space required for the m levels of redundancy symbols is less than the space which would be required all the ri level-1 redundancy symbols. Accordingly, the scheme offers more protection than prior multi-level encoding schemes and uses less storage space.

As is understood by those skilled in the art, the data and redundancy symbols may be stored, or recorded, in any format. The block format shown in the figures is for explanatory purposes only.

Figure 4:
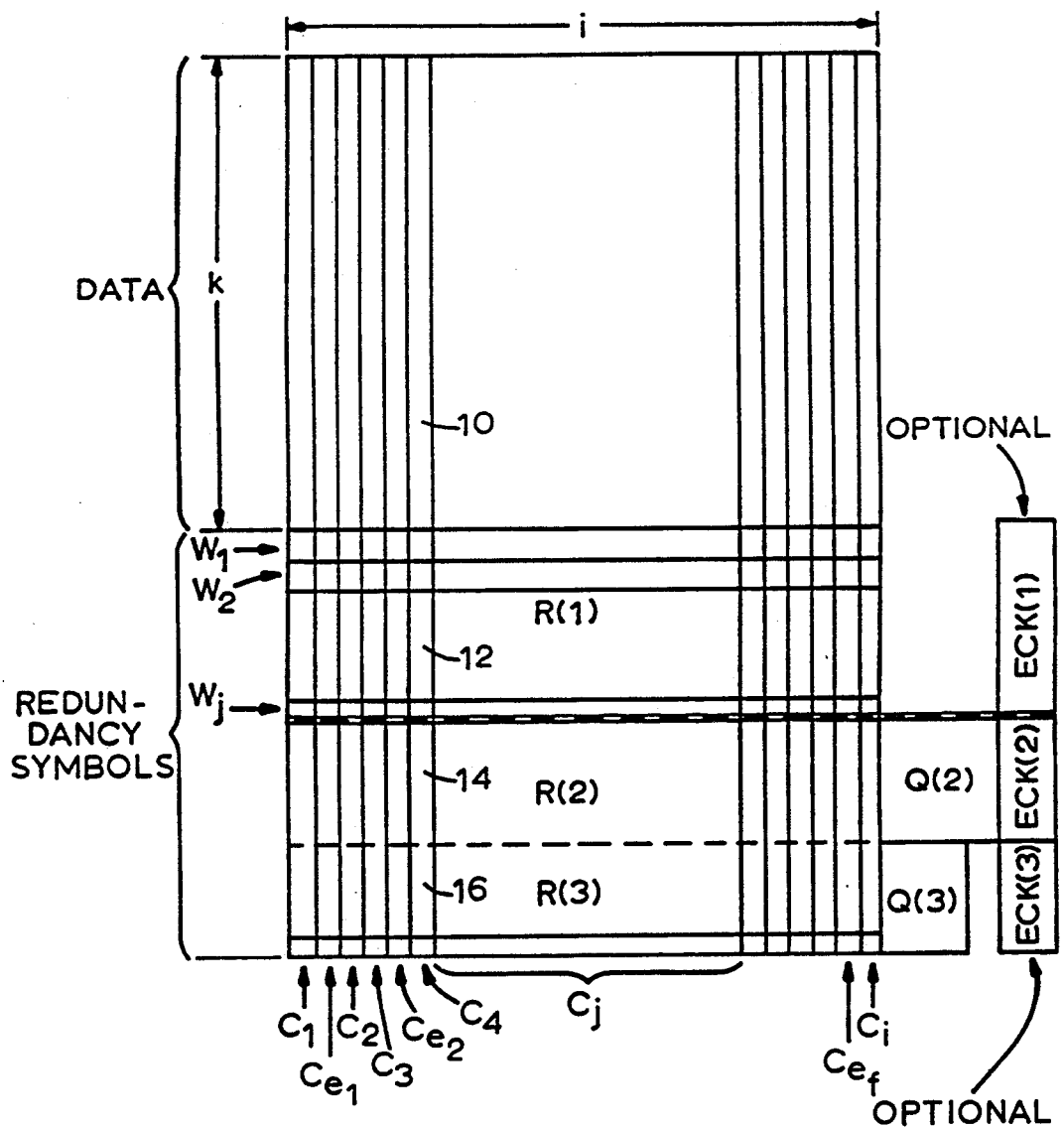
FIG. 4 is a block diagram of retrieved code words including re-generated redundancy symbols.
Figure 4A:
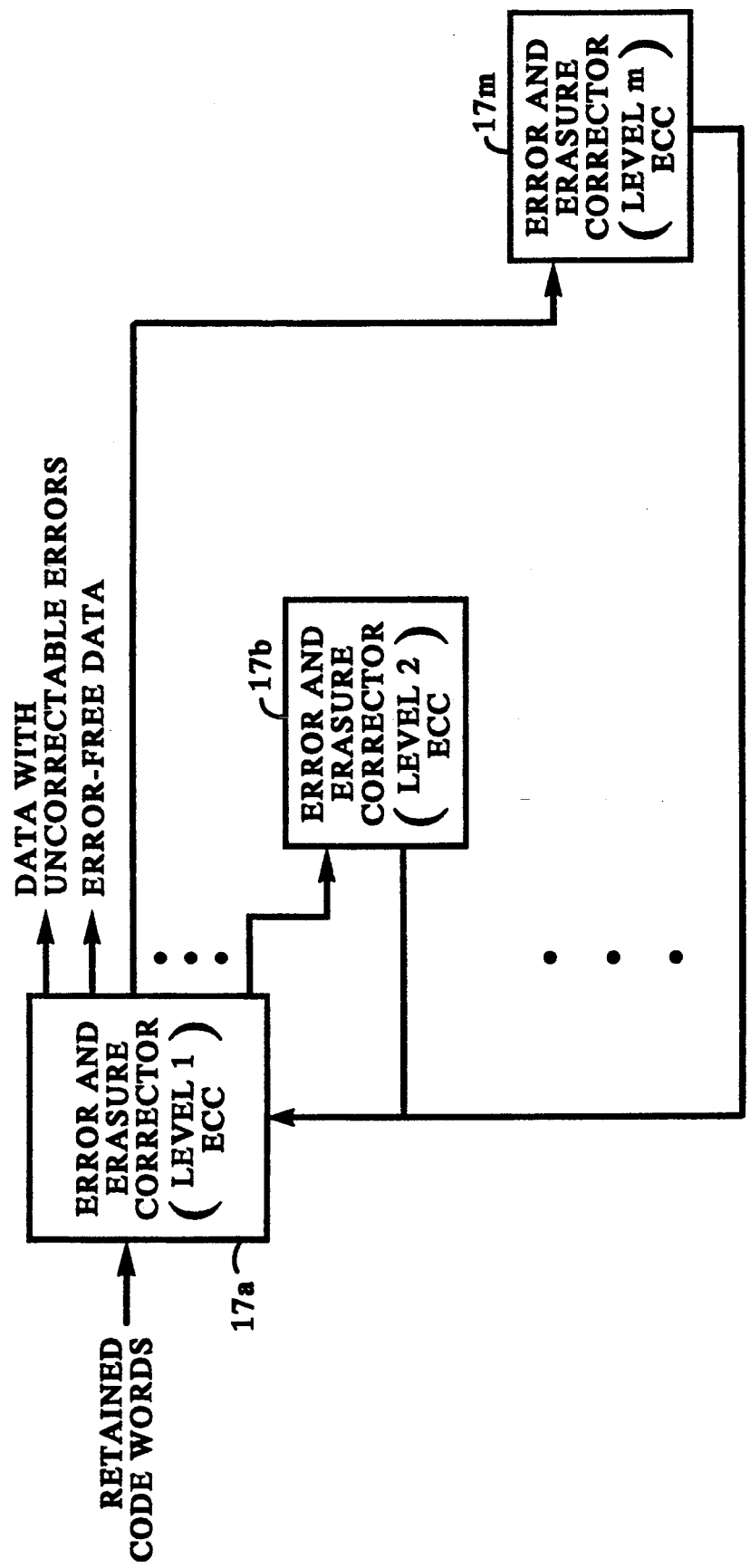
FIG. 4A depicts a decoding system.

When the stored information is later retrieved, the system uses the retrieved section R(1) redundancy symbols to re-generate for each code word the "erased" section R(2) and R(3) level-1 redundancy symbols using conventional error and erasure correcting techniques. It also uses the section R(1) redundancy symbols to correct errors in the retrieved data and redundancy symbols. FIG. 4 illustrates several re-generated columns, e.g., $c_1$, $c_2$, etc. FIG. 4A depicts a decoding system which includes error and erasure correction circuits 17a, 17b, ... 17m, each of which corrects errors and erasures using an associated level-1, level-2, ... level-m error correction code.

If the system does not generate a valid code word for a particular section of data, i.e., a particular column, it treats the associated section R(2) and R(3) symbols as errors with known locations, e.g., columns $c_{e1}$, $c_{e2}$ ... $c_{ef}$. It then decodes each row of section R(2) using the appropriate section Q(2) redundancy symbols and the level-2 ECC and fills in the erased section R(2) symbols in the columns $c_{e1}$, $c_{e2}$ ... $c_{ew}$, as appropriate. The system next tries to correct any remaining errors in the retrieved data and section R(1) symbols of these columns using the level-1 ECC and the appropriate section R(1) and R(2) redundancy symbols.

If the system can not correct all the errors and regenerate all the erased redundancy symbols using the level-1 ECC and the sections R(1) and R(2) redundancy symbols, it uses the section Q(3) redundancy symbols and the level-3 ECC to fill in any missing section R(3) symbols. It then uses these filled in symbols and the section R(1) and R(2) redundancy symbols with the level-1 ECC to correct more errors. If necessary, and if there are more levels, the system repeats the correction procedure for each such level.

Before the system re-generates the erased section R(2) and R(3) symbols, it uses the optional ECC symbols, if any, to correct any errors in the retrieved section R(1), Q(2) and Q(3) redundancy symbols. Next the system performs the level-1 error and erasure correction to fill in the erased redundancy symbols and correct errors the retrieved data in section R(1) redundancy symbols. It them follows the procedures set forth above to correct the errors.

If the system performs its higher levels of decoding, it is encountering badly corrupted data. The system may thus signal to a system operator that the data is badly corrupted, and the system operator may then examine the recording medium and salvage the stored data before it becomes irretrievably lost. Prior art systems which use only two levels of decoding are not so warned of corrupted data, and thus, they may eventually lose data to corrupted media.

Figure 5:
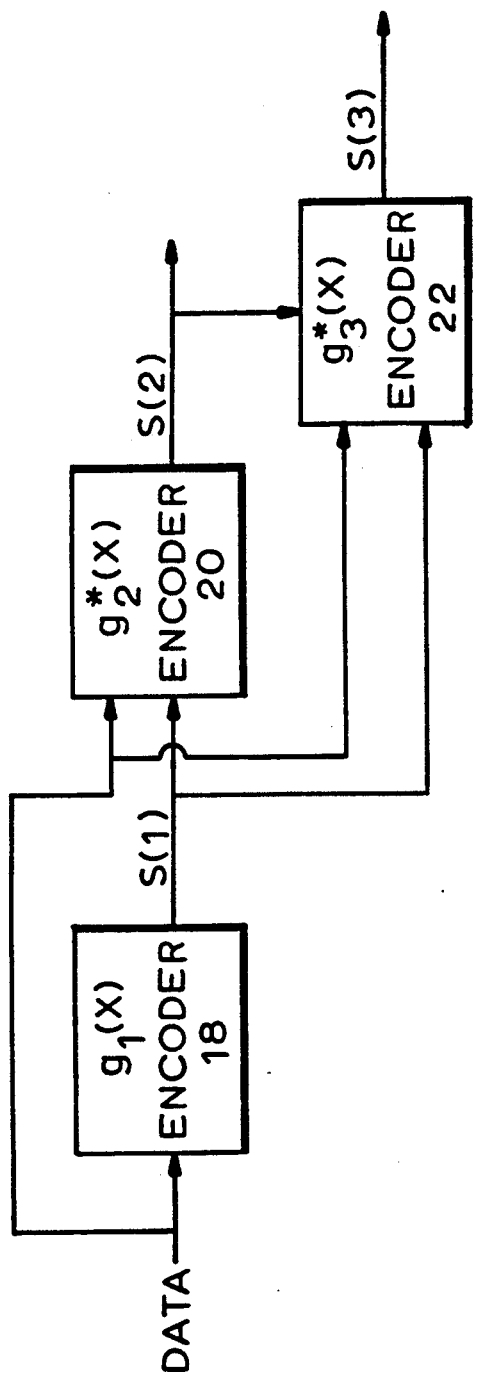
FIG. 5 is a block diagram of an encoding system which encodes data to form code words in accordance with a second embodiment of the current invention.
Figure 6:
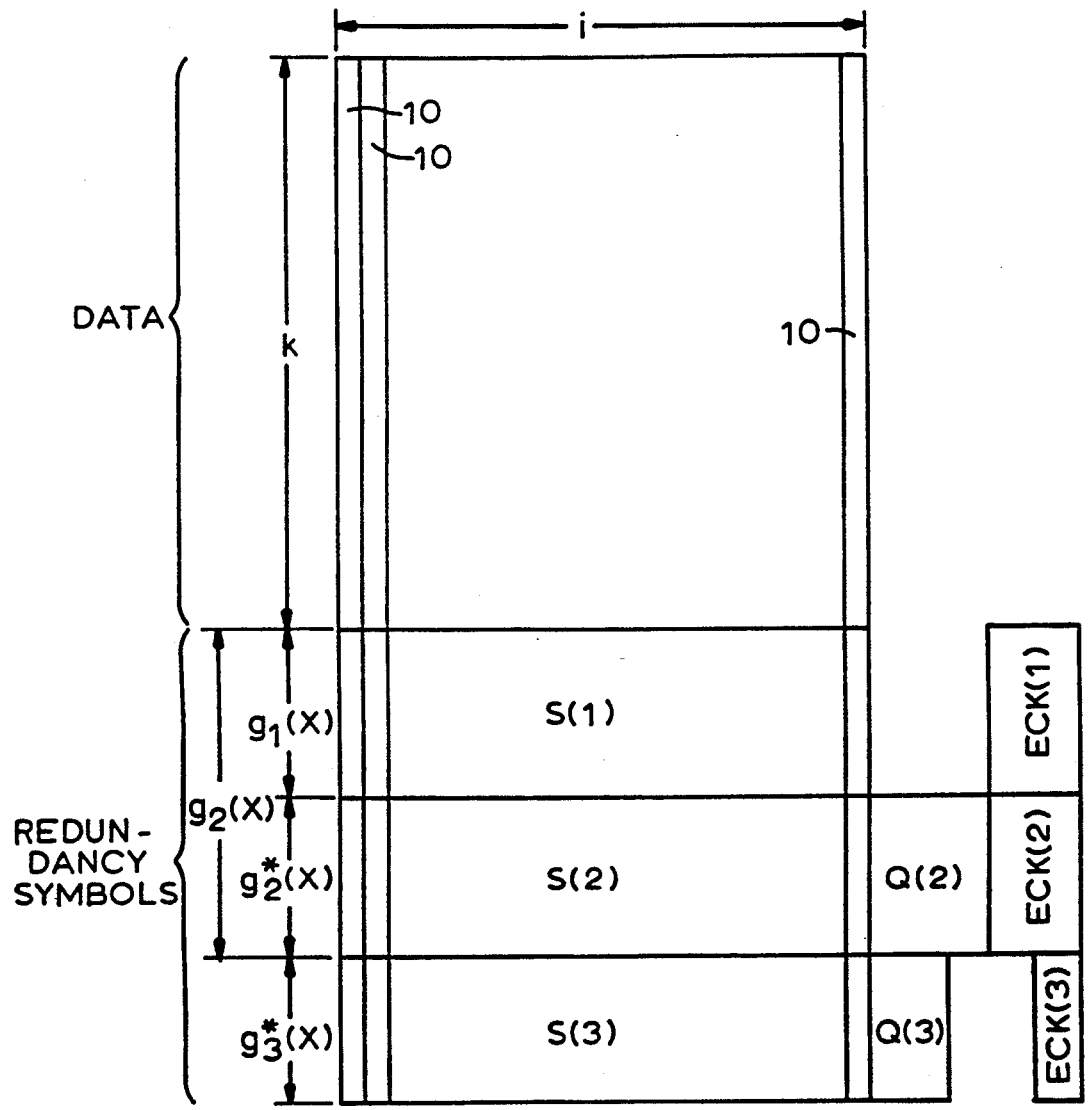
FIG. 6 is a block diagram of the code words generated by the encoder shown in FIG. 5.

FIGS. 5 and 6 illustrate a second embodiment of the current invention which can be used in conjunction with an existing one-level encoding system. The one-level system encodes the ki data symbols after (optionally) interleaving them. It encodes them in k-symbol sections in encoder 18 to form code words in accordance with an ECC which has a consecutive root generator polynomial, $g_1(x)$:

$$(x+a^a)*(x+a^{a+1})*(x+a^{a+2})*(x+a^{a+3})* \ldots *(x+a^{a+s})$$

where * represents Galois Field multiplication and $\alpha$ is a primitive polynomial of the Galois Field $GF(2^t)$ used to encode the data.

The code words consist of k data symbols and s redundancy symbols and are arrayed as columns 10 in FIG. 6, with the si redundancy symbols for all the code words depicted as section S(1) in the drawings. The code words are next applied to a second encoder 20 for a second level of encoding. This level of encoding is associated to with an ECC which has as a generator polynomial, $g_2(x)$, an expanded version of $g_1(x)$:

$$(x + \alpha^{a-d}) * (x + \alpha^{a-d+1}) * \ldots * (x + \alpha^{a}) * \ldots * (x + \alpha^{a+s}) * (x + \alpha^{a+s+1}) * \ldots * (x + \alpha^{a+s+d})$$

$$\underbrace{\qquad\qquad\qquad g_1(x) \qquad\qquad\qquad}$$

This second ECC is more powerful, that is, it corrects more errors in a given amount of data than the ECC which is associated with $g_1(x)$.

The data symbols have already been encoded in accordance with $g_1(x)$ by the one-level encoder 18 to produce the section S(1) redundancy symbols. Accordingly, the code word data symbols and S(1) redundancy symbols are treated as information symbols and the second encoder 20 actually encodes the symbols in accordance with the factors of $g_2(x)$ which are not part of $g_1(x)$. Thus encoder 20 encodes the symbols in accordance with a polynomial $g^*_2(x)$ which is equal to $g_2(x)/g_1(x)$. This second encoding generates, for each code word, redundancy symbols depicted as section S(2) in FIG. 6. The section S(2) redundancy symbols alone do not provide adequate error protection to the data because the polynomial, $g_2^*(x)$, used to generate them may not have as many consecutive roots in $GF(2^f)$ as $g_1(x)$. However, the section S(2) symbols together with the corresponding section S(1) symbols protect the data symbols with the relatively powerful ECC having as a generator polynomial $g_2(x)$.

Third, fourth, . . . , m levels of encoding may be performed in the same manner. A third level of encoding, for example, uses a generator polynomial $g_3^*(x) = g_3(x)/g_2(x)$, where $g_3(x)$ is an expanded version of $g_2(x)$. Thus encoders for these levels, for example, encoder 22 for m-level encoding, encode the data symbols and the corresponding section S(1) . . . S(m−1) redundancy symbols in accordance with a polynomial $g^*_m(x)$ which is equal to the quotient of $g_m(x)$, which is the expanded version of $g_{m-1}(x)$, divided by the generator polynomial associated with the previous level, $g_{m-1}(x)$. The level-m generator polynomial thus includes consecutive roots, also, and protects the data with an even more powerful ECC.

The redundancy symbols generated for each level of encoding are depicted in sections S(1) . . . S(m) in FIG. 6. These redundancy symbol sections correspond to the section R(1), R(2) . . . R(m) of FIG. 2. Referring again to FIG. 6, the redundancy symbols in sections S(2) . . . S(m), where m=3 in this embodiment, are then encoded, as information symbols, to generate the redundancy symbol depicted in sections Q(2) and Q(3), as discussed above with reference FIG. 3.

After the data and the levels-2 and 3 redundancy symbols have been encoded to generate the symbols depicted in sections Q(2) and Q(3), the system further encodes the redundancy symbols in sections Q(2) and Q(3), using one or more ECCs, and generates redundancy symbols ECK(2) and ECK(3). The system then stores these redundancy symbols along with the data symbols, the section S(1) redundancy symbols and the section Q(2) and Q(3) redundancy symbols. It does not store the section S(2) and S(3) redundancy symbols, however, because these symbols can be regenerated using the stored redundancy symbols. This second embodiment is different than the first, in that the system is required to encode the section Q(2) . . . Q(m) redundancy symbols. The system may (optionally) encode the section S(1) symbols to form section ECK(1) symbols, as in the first embodiment.

The data symbols 10 are protected by all m levels of encoding. The $m^{th}$ level protects them using $g_m(x)$ which is much more powerful ECC than the one used in level-1, without requiring the storage of the large number of redundancy symbols. Prior systems require for such protection the storage of all the redundancy symbols from all levels of encoding.

Decoding is performed by the system in levels, as discussed above with respect to the first embodiment. The system starts with the level-1 ECC and uses higher levels, as necessary, to regenerate the erased symbols and correct additional errors. Each level provides a much more powerful error correction mechanism, due to the use of a generator polynomial which has more terms than the one used in the previous level. Also, each level uses redundancy symbols filled by the codes associated with appropriate section Q(2) . . . Q(m) and thus uses error free redundancy symbols. Accordingly correction can be performed relatively quickly.

The inventive multi-level encoding scheme protects data symbols with powerful ECCs without, as expected with prior art systems, increasing the complexity of encoders/decoders, requiring additional storage space, or drastically increasing the time required for error correction. The scheme encodes redundancy symbols from the various lower encoding levels and treats them as erasures. The encoding scheme can thus give the data symbols powerful error protection without the storage of the number of redundancy symbols required with prior systems.

The inventive system uses the various levels of redundancy symbols during the multi-level decoding to correct both errors and erasures. Each decoding level corrects only a portion of the erasures and/or errors in the retrieved symbols. Accordingly, error correction can be performed relatively quickly using, in higher levels of decoding, either ECCs of decreasing complexity, as in the first embodiment, or powerful ECC's which are required to correct relatively few errors, as in the second embodiment.

The foregoing description has been limited to two specific embodiments of this invention. It will be apparent, however, that variations and modifications may be made to the invention, with the attainment of some or all of its advantages. Therefore, it is the object of the appended claims to cover all such variations and modifications as come within the true spirit and scope of the invention.

I claim:

1. A method of protecting "ki" data symbols against errors, where the symbols are represented by electrical signals, said method including the steps of:

A. segmenting the ki data symbols into i sections and encoding each of the sections in accordance with a first error correction code to generate "r" redundancy symbols and concatenating the data symbols and the r redundancy symbols to form "i" level-1 code words, each of said level-1 code words containing "k" data symbols and r redundancy symbols;

B. sectioning said r redundancy symbols in each level-1 code word into "m" multi-symbol section R(1), R(2), ..., R(m);

C. encoding the corresponding redundancy symbols in the section R(2) from all of said level-1 code words in accordance with a second error correction code to generate a set Q(2) of redundancy symbols;

D. applying the procedures of step C for each of the remaining R(3) ... R(m) redundancy symbol sections said encoding generating sets Q(3), ..., Q(m) of redundancy symbols; and E. retaining the signals representing said data symbols, said section R(1) redundancy symbols and said sets Q(2), Q(3), ..., Q(m) of redundancy symbols to form a code word block.

2. The error protection method of claim 1, wherein said R(3), ... R(x) ..., R(m) redundancy symbol sections are each encoded using a different error correction code, and said error correction code used to encode a redundancy symbol section R(x) is designed to correct fewer errors than the codes used to encode the data, and redundancy symbol section R(2), ... R(x−1).

3. The error protection method of claim 1, said method further including the step of interleaving the ki data symbols.

4. The error protection method of claim 1, said method further including the step of decoding and correcting errors in the data symbols, the step of decoding and correcting errors in the data symbols including the steps of:

F. treating said section R(2), R(3), ..., R(m) symbols which are not retained in step E as erasures;

G. filling in, in each level-1 code word, signals representing as many of said erasures and correcting as many errors in said level-1 code words as possible using said first error correction code;

H. treating said ki data symbols as error-free, if all of said redundancy symbols in said level-1 code word are filled in;

I. filling in, in one of said sections R(2), ..., R(m), in each level-1 code word in which symbols in said section are not filled in, signals representing said erasures in said section using an associated set Q(2), ..., Q(m) of the redundancy symbols and the error correction code used to produce the symbols of said associated section;

J. correcting errors in said level-1 code words in which the redundancy symbols were filled in by the predecding step, using said first error correction code, said section R(1) redundancy symbols and the redundancy symbols of the section filled in during the preceding step;

K. if any redundancy symbols in said level-1 code words are not filled in:
   i. applying the procedures of step I to another one of said section R(2), ..., R(m) in which symbols are not filled in, and
   ii. correcting errors in said level-1 code words in which symbols were filled in by the procedure in step i, using said first error correction code, the redundancy symbols of said sections R(1) and said sections filled in by the preceding steps, where a symbol is corrected by changing the condition of the signal representing the symbol and an erasure is filled in by setting the signal representing the erasure to a condition determined using the associated error correction code; and L. repeating step K for each remaining section R(2), ..., R(m) of said r redundancy symbols to produce signals representing error-free data symbols.

5. The error protection method of claim 4, wherein said R(3), ... R(x) ..., R(m) redundancy symbol sections are each encoded using a different error correction code, and said error correction code used to encode a redundancy symbol section R(x) is designed to correct fewer errors than the codes used to encode the data, and redundancy symbol sections R(2), ... R(x−1).

6. An error correction system for encoding electrical signals representing "ki" data symbols to protect said data symbols against errors, said system including:

A. a first encoder for separating the ki data symbols into "i" sections and encoding the sections in accordance with a first error correction code to generate for each section "r" redundancy symbols and concatenating the redundancy symbols with the data symbols to form i level-1 code words, each of said level-1 code words containing "k" data symbols and r redundancy symbols;

B. means for sectioning said r redundancy symbols in each level-1 code word into "m" multi-symbol section R(1), R(2), ..., R(m);

C. a second encoder for encoding the corresponding redundancy symbols in section R(2) from all of said level-1 code words in accordance with a second error correction code to generate a set Q(2) of redundancy symbols, said second encoder encoding each of the remaining redundancy symbol sections to generate sections Q(3), ..., Q(m) of redundancy symbols, respectively; and D. means for forming a code word block with signals representing said data symbols, said section R(1) redundancy symbols and said sections Q(2), Q(3), ..., Q(m) redundancy symbols.

7. The error correction system of claim 6, wherein said second encoder encodes each of said R(2), ... R(x) ..., R(m) sections of said r redundancy symbols using for each section R(x) a selected error correction code which is designed to correct fewer errors than the code used to encode the symbols of section R(x−1).

8. The error correction system of claim 6, wherein said first encoder interleaves the ki data symbols before separating the ki data symbols into said i sections.

9. The error correction system of claim 6, wherein said system further includes:

E. a first correcting means for:
   i. correcting said section R(2), ..., R(m) redundancy symbols as erasures and correcting any erroneous retained data and section R(1) symbols using said level-1 error correction code, and
   ii. treating said ki data symbols as error-free, if all of said redundancy symbols in said level-1 code word are filled in; and F. a second correcting means for:
   filling in, in one of said sections R(2), ..., R(m), in each level-1 code word in which symbols in said section are not filled in, signals representing said erasures in said section using an associated set Q(2), ..., Q(m) of the redundancy symbols and the error correction code used to produce the symbols of said associated section;
   i. filling in, in one of said sections said sections R(2), ..., R(m) symbols not filled in by said first correcting means using an associated set of Q(2), ..., Q(m) redundancy symbols and the error correction code used to encode said section R(2), ..., R(m) symbols, and ii. applying said level-1 code words to said first correcting means for further error correction, after each of said sections R(2) ... R(m) is filling in;

said first and second correcting means correcting a symbol by changing the condition of the signal representing the symbol and filling in a symbol by setting the signal representing the symbol to a condition determined by the associated error correction code, said second error correcting means filling in additional sections of redundancy symbols if said first correcting means does not correct all the errors.

10. A method of formulating electrical signals representing a code word block associated with signals representing "ki" data symbols, said method including the steps of:

A. sectioning the ki data symbols into i sections and encoding the sections over a Galois Field $GF(2^f)$ using a first error correction code $ECC_1$ and generating redundancy symbols and concatenating the data symbols and the redundancy symbols to form "i" level-1 code words, each of said i level-1 code words containing "k" data symbols and "s" redundancy symbols, said first error correction code having a generator polynomial, $g_1(x)$, with consecutive roots in $GF(2^f)$:

$$g_1(x+\alpha^a)*(x+\alpha^{a+1})*(x+\alpha^{a+2})*(x+\alpha^{a+3})* \ldots *(x+\alpha^{a+s})$$

where * represents Galois Field multiplication and $\alpha$ is a primitive polynomial of $GF(2^f)$, said redundancy symbols being associated with a section S(1) of redundancy symbols;

B. encoding, to generate a second set of redundancy symbols associated with a section S(2), said k data symbols in each of said i level-1 code words and the corresponding symbols in section S(1) using a second error correction code $ECC_2$ having a generator polynomial, $g^*_2(x)$, which is equal to a generator polynomial, $g_2(x)$ $$g_2(x)=(x+\alpha^{a-d})*(x+\alpha^{a-d+1})* \ldots *(x+\alpha^a)* \ldots *(x+\alpha^{a+s})*(x+\alpha^{a+s+1})* \ldots *(x+\alpha^{a+s+d})$$

divided by said generator polynomial, $g_1(x)$, said polynomial $g_2(x)$ being an expansion of $g_1(x)$;

C. applying the procedures of Step B to the data and redundancy symbols previously generated a predetermined number of times and generating sections S(3) ... S(m) of redundancy symbols;

D. further encoding each of said sections of S(2) ... S(m) redundancy symbols to generate associated sections of redundancy symbols Q(2) ... Q(m);

E. encoding each of said sections Q(2) ... Q(m) of redundancy symbols to generate sections ECK(2) ... ECK(m) redundancy symbols; and F. retaining signals representing said ki data symbols, said section S(1) redundancy symbols, said section Q(2) ... Q(m) redundancy symbols and said section ECK(2) ... ECK(m) redundancy symbols and concatenating the signals to form a code word block.

11. The method of claim 10, said method further including the step of interleaving the ki data symbols.

12. The method of claim 10, said method further including the steps of:

G. correcting erroneous data symbols in said ki data symbols using said section S(1) redundancy symbols and said first error correction code;

H. if all erroneous data symbols are not corrected in step G, filling in said section S(2) redundancy symbols using said section Q(2) redundancy symbols and said error correction code used to generate said section Q(2) redundancy symbols;

I. correcting said erroneous data symbols using said filled in section S(2) redundancy symbols and said second error correction code $ECC_2$;

J. if all erroneous data symbols are not corrected in step H selecting another section of redundancy symbols S(x), $x \leq m$, and filling in the selected section of redundancy symbols using said corresponding section Q(x) redundancy symbols and an associated error correction code $ECC_x$;

K. correcting erroneous data symbols using $ECC_x$; and

L. repeating steps J and K;

said correcting steps correcting a symbol by changing the condition of the signal representing the symbol and said filling in steps setting the condition of the signal representing the filled in symbol to a condition determined by the associated error correction code.

13. An error correction system for encoding electrical signals representing "ki" data symbols to generate signals representing a code word block, said system including:

A. encoding means for 1. separating said ki data symbols into i sections and encoding the i sections over a Galois Field $GF(2^f)$ using a first error correction code to generate for each section "r" redundancy symbols and concatenating the redundancy symbols with the data symbols to form "i" level-1 code words, each of said i level-1 code words containing "k" data symbols and "s" redundancy symbols, said first error correction code having a generator polynomial, $g_1(x)$, with consecutive roots in $GF(2^f)$:

$$g_1(x+\alpha^a)*(x+\alpha^{a+1})*(x+\alpha^{a+2})*(x+\alpha^{a+3})* \ldots *(x+\alpha^{a+s})$$

where * represents Galois Field multiplication and $\alpha$ is a primitive polynomial of $GF(2^f)$, said s redundancy symbols forming a section, S(1), of redundancy symbols;

2. generating a section, S(2), of redundancy symbols by encoding said k data symbols and said section S(1) redundancy symbols in each of said i level-1 code words using a second error correction code having a generator polynomial, $g^*_2(x)$, which is equal to $g_2(x)$ divided by $g_1(x)$, where $g_2(x)$, which is an expanded version of $g_1(x)$, is:

$$g_2(x)=(x+\alpha^{a-d})*(x+\alpha^{a-d+1})* \ldots *(x+\alpha^a)* \ldots *(x+\alpha^{a+s})*(x+\alpha^{a+s+1})* \ldots *(x+\alpha^{a+s+d})$$

3. generating a set Q(2) of redundancy symbols by encoding said section S(2) redundancy symbols;

4. generating a section ECK(2) of redundancy symbols by encoding said set Q(2) redundancy symbols; and B. means for concatenating signals representing said ki data symbols, said section S(1) redundancy symbols, said set Q(2) and section ECK(2) of redundancy symbols to form a code word block.

14. The system of claim 13, wherein said system further includes:

F. encoding means for separately encoding said ki data symbols and said sections of redundancy symbols S(i) and generating a next section S(i+1) of redundancy symbols using an error correcting code $ECC_{i+1}$ having a generator polynomial, $g^*_{i+1}(x)$, which is equal to the generator polynomial, $g_{i+1}(x)$, which is an expansion of the generator polynomial $g_i(x)$ associated with the preceding level, divided by said generator polynomial $g_i(x)$;

G. encoding means for encoding each of said sections S(i) of redundancy symbols to generate another section of redundancy symbols Q(i);

H. encoding means for encoding said Q(i) sections of redundancy symbols to generate for each section redundancy symbols ECK(i); and I. means for retaining said data symbols, said section S(1) redundancy symbols, said sections Q(2), ..., Q(i) of redundancy symbols, and said sections of redundancy symbols ECK(2), ..., ECK(i).

15. The system of claim 14, wherein said system further includes:

J. means for correcting erroneous data symbols in said ki data symbols using said section S(1) redundancy symbols and said first error correction code $ECC_1$;

K. means for filling in, in each code word said section S(2) redundancy symbols using said set Q(2) of redundancy symbols and said error correction code $ECC_1$ used to generate said set Q(2) of redundancy symbols, said S(2) redundancy symbols being filled in if all of said erroneous data symbols are not corrected;

L. means for correcting said erroneous data symbols using said filled-in section S(2) redundancy symbols and said second error correction code having said generator polynomial $g^*_2(x)$;

M. means for filling in, in each code word, said section S(i) redundancy symbols, $3 \leq i \leq m$ using said corresponding section Q(i) redundancy symbols and said corresponding error correction code $ECC_i$, said S(i) redundancy symbols being filled in if all of said erroneous data symbols are not corrected; and N. means for correcting said erroneous data symbols using said filled-in section S(i) redundancy symbols and said corresponding error correction code $ECC_i$;

said means for correcting erroneous symbols correcting a symbol by changing the condition of the signal representing the symbol and said means for filling in setting the condition of the signal representing the filled in symbol to a condition determined by the associated error correction code, wherein if the data is not corrected after a first of said S(i) sections is filled in, a next section is filled in and correction is again attempted.

16. The system of claim 13, wherein said system further includes:

F. means for correcting signals representing erroneous data symbols in said ki data symbols using said section S(1) redundancy symbols and said first error correction code $ECC_1$;

G. means for filling in, in each code word, said section S(2) redundancy symbols using said set Q(2) of redundancy symbols and said error correction code $ECC_2$, said S(2) redundancy symbols being filled in if all of said erroneous data symbols are not corrected;

H. means for correcting said erroneous data symbols using said filled in section S(2) redundancy symbols and said second error correcting code $ECC_2$;

said means for correcting erroneous data symbols correcting a symbol by changing the condition of the signal representing the symbol and said means for filling in setting the condition of the signal representing the filled in symbol to a condition determined by the associated error correction code.

* * * * *